United States Patent [19]
Thornburg

[11] 3,975,755
[45] Aug. 17, 1976

[54] STABLE NON-CRYSTALLINE MATERIAL FOR SWITCHING DEVICES

[75] Inventor: David D. Thornburg, Los Altos, Calif.

[73] Assignee: Xerox Corporation, Stamford, Conn.

[22] Filed: Mar. 17, 1975

[21] Appl. No.: 558,993

[52] U.S. Cl. .................................. 357/2; 357/61
[51] Int. Cl.² ...................................... H01L 45/00
[58] Field of Search ............ 338/25, 20, 21, 22 SD; 357/2, 61; 427/85, 87

[56] References Cited
UNITED STATES PATENTS
3,432,729  3/1969  Dyre ...................................... 357/2

OTHER PUBLICATIONS
Electronic and Structural Properties of Amorphous Semiconductors, Le Comber et al., Eds., Academic Press, N.Y., 1973, p. 66.

Primary Examiner—William D. Larkins
Attorney, Agent, or Firm—J. E. Beck; T. J. Anderson; Leonard Zalman

[57] ABSTRACT

A switching device having as the active switching element a material with a band gap between 0.6 and 1.2 eV and a mean coordination number of 4. These parameters provide a material having a glass transition temperature that is relatively high such that the material is resistant to devitrification. Amorphous (a-) $CdAs_2$ is the most promising active switching material having the parameters, and a method of making thin films of a-$CdAs_2$ by open source evaporation is disclosed.

2 Claims, 4 Drawing Figures

STABLE NON-CRYSTALLINE MATERIAL FOR SWITCHING DEVICES

BACKGROUND OF THE INVENTION

Threshold switching and current controlled negative differential resistance effects have been achieved by two terminal devices utilizing a wide variety of amorphous semiconductors, such as glasses from the $As_2(Se,Te)_3$ system. For these devices to be used extensively, that is, to gain wide acceptance by the technical community, the amorphous semiconductor material must be highly resistant to devitrification, that is, have a high glass transition temperature, and be easily manufactured into a thin film. The $As_2(Se,Te)_3$ system of glasses are not easily manufactured, requiring flash evaporation deposition, and have a glass transition temperature of only about 110°–170°C.

OBJECT OF THE INVENTION

It is an object of the invention to provide an improved switching device.

It is a further object of the present invention to provide a switching device that is highly resistant to devitrification.

SUMMARY OF THE INVENTION

In accordance with the invention, a scientific method of high reliability amorphous semiconductor material selection is provided. The selection method is based on the discovery that glass stability at fixed band gap is increased with increasing atomic coordination number and from the discovery that useful switching effects are displayed in semi-conductors with band gaps in the range 0.6 to 1.2 eV.

One amorphous (a-) semiconductor material that meets the above criteria is $a-CdAs_2$ which has a coordination number of 4 and a band gap of 0.8 eV. Previous studies of cadmium and arsenic, see German Patent No. 1,213,076, have indicated that $a-CdAs_2$ is not a good glass former, requiring the additives germanium and silicon, that is, a ternary system of CdGeAs or CdSiAs to make it a good glass former. In accordance with the invention, it is shown that while $a-CdAs_2$ is not a good glass former, it is producible as a thin film by evaporation from an open source, that is, bulk evaporation, as opposed to the requirement of flash evaporation for formation of glasses of the $As_2(Se,Te)_3$ system.

DESCRIPTION OF PREFERRED EMBODIMENTS AND METHODS

The conditions under which a material can be formed in the non-crystalline state are best thought of in terms of the kinetic parameters controlling nucleation and growth of the crystalline phase from the supercooled liquid. It is important to distinguish between the glass forming ability and the glass stability of a given composition material. Ease of glass formation does not necessarily imply that the resulting glass will be stable against crystallization; in fact, certain amorphous materials (e.g., a-Ge) are very hard if not impossible to produce by quenching from the melt, but are considerably more stable than certain other materials known for their glass forming ability (e.g., a-Se).

Figure 1:
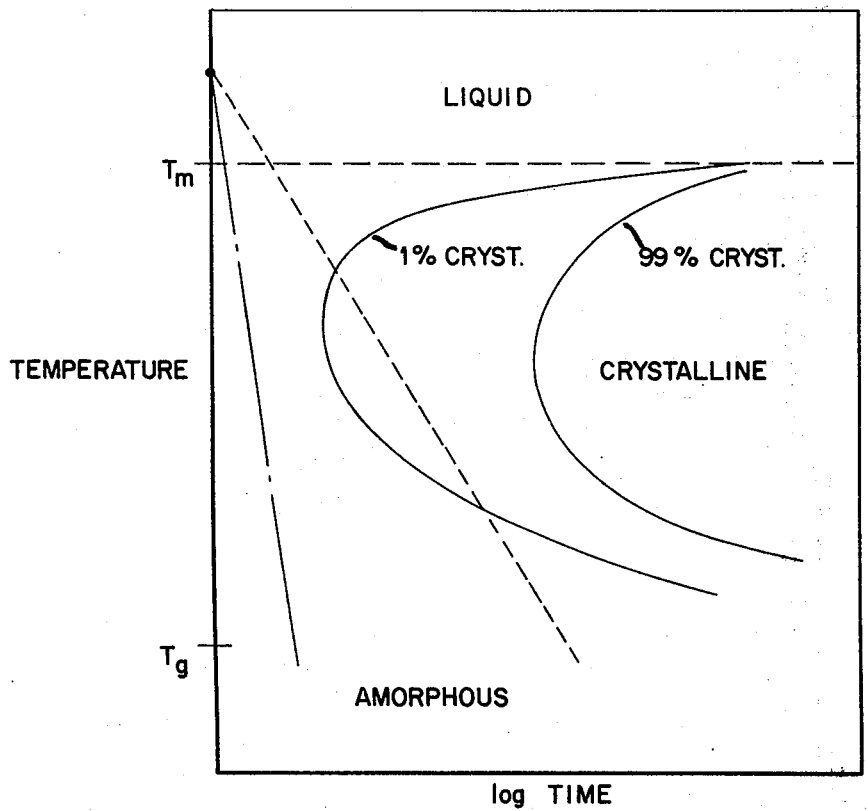
FIG. 1 is a schematic time-temperature-transformation curve showing quench rates needed for glass formation (dot-dash line) and for a partially crystallized sample (dotted line).

Glass formation results from quenching a melt sufficiently fast so as to avoid perceptible nucleation and growth of the crystalline phase. Studies of glass formation kinetics has led to the derivation of time-temperature-transformation (TTT) curves for selected materials. A TTT diagram (as shown in FIG. 1) represents the locus of temperatures and times at which a sample must be annealed in order to crystallize to the volume percentage shown in each curve. If the 1 percent curve is cleared to the left by rapid quenching, as shown by the dot-dash line in FIG. 1, a glassy material will be obtained. Slower quench rates which intersect the 1 percent curve (the dashed line in FIG. 1) will result in samples which are partially crystallized.

A useful measure of glass forming tendency for a specific substance can be found from differential thermal analyses (DTA) of a glass sample. At a fixed heating rate, the glass transition temperature ($T_g$), onset of crystallization ($T_c$) and melting point ($T_m$) are measured. From prior publications it is known that since:

a. all glasses are in comparable states at $T_g$
b. the interval $T_c - T_g$ is directly proportional to glass forming tendency, and
c. the interval $T_m - T_c$ is inversely proportional to glass forming tendency, then the coefficient $$K_{gl} = \frac{T_c - T_g}{T_m - T_c} \tag{1}$$

measures the glass forming ability of a given material. Glass stability, on the other hand, depends on $T_g$ alone since at $T_g$ and above, the covalent bonding network begins to break apart as evidenced from the appearance of translational modes in the heat capacity. Below $T_g$, glasses are generally stable in a kinetic sense, although they are clearly not in thermodynamic equilibrium. It thus follows that ease of glass formation is unrelated to the stability of the resultant amorphous material. For switching device applications it is glass stability and not glass forming ability to which primary consideration must be given.

An understanding of glass stability has been aided by the observation that, for certain families of non-crystalline materials, a linear relation exists between $T_g$ and the band gap ($E_g$). The fact that such a relation exists for certain alloy systems (e.g., $As_2Se_3-As_2Te_3$) and not for others is believed due to the straight line relationship which exists between $T_g$ and $E_g$ for covalent glasses with the same average coordination number, C, with this relationship conforming to the equation $$T_g = T_{g0} + \alpha E_g (C-2) \tag{2}$$

where
$T_{g0} = 350\ K$
and $\alpha = 200$ K ev$^{-1}$

Thus, glass stability increases with both band gap and average coordination number.

From the standpoint of device physics, limitations are imposed on both $C$ and $E_g$. Covalent materials can have a maximum of 4 bonds per atom, thus restricting $C$ to values of 4 or less. The limitation of practical values of $E_g$ can be seen in the context of a specific switching mechanism. In the case of switching effects which are purely thermal in origin, it can be shown for thin film sandwich structure devices that the device temperature rise at turnover, $T_T$, is approximately given by $$T_T = \frac{E_g}{4K} \left(1 - [1 - \frac{8k\,T_0}{E_g}]^{1/2}\right) \quad (3)$$

and the turnover voltage, $V_T$, is usually well approximated by $$V_T^2 = \frac{2k\,T_T^2 \rho_o \exp(E_g/2kT_T) d_f k_s}{E_g d_s} \quad (4)$$

in which
$T_0$ = ambient temperature (K)
$\rho_o \exp(E_g/2kT)$ = the assumed resistivity function for the active material ($\Omega$cm)
$d_f$ = active material film thickness (cm)
$k_s$ = substrate thermal conductivity ($W\,cm^{-1}K^{-1}$)
and
$d_s$ = substrate thickness (cm)

Figure 2:
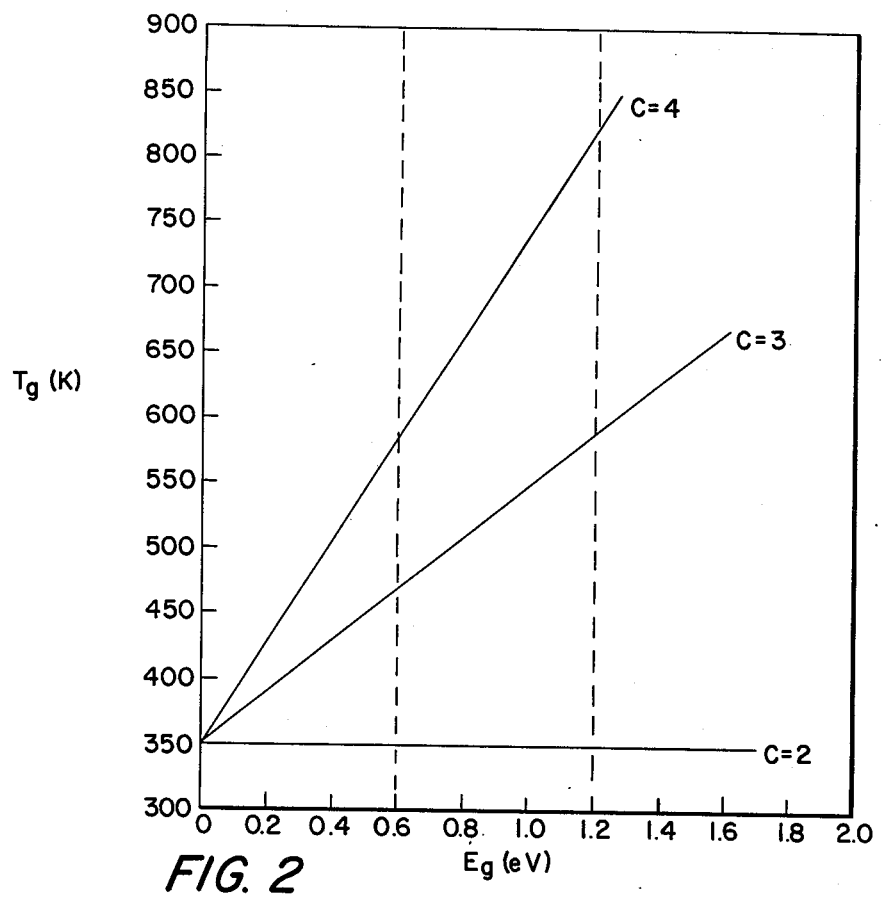
FIG. 2 is a plot of glass transition temperature ($T_g$) v. band gap ($E_g$) for different means coordination numbers.

Table 1 shows the dependence of $T_T$ and $V_T$ on $E_g$ for typical values of the parameters ($T_0 = 300K$, $\rho_o = 10^{-3}$ $\Omega$cm, $d_f = 10^{-4}$cm, $k_s = 10^{-2}$ $W$cm$^{-1}$K$^{-1}$, $d_s = 10^{-2}$cm). The pronounced dependence of $V_T$ on $E_g$ severely limits the range of useful band gaps to the approximate range 0.6 → 1.2 eV, even if large variations in $\rho_o$ are allowed. In the present context of material selection, this band gap restriction limits us to the materials falling within the shaded region of FIG. 2. Furthermore, the most desired materials lie along the $C = 4$ line at the upper band gap limit, since the most stable devices should use glasses which maximize the quantity $T_g - T_T$. The potential advantages in lifetime of a highly coordinated glass ($C = 4$) can be seen from FIG. 2 by comparison with commonly used glasses of lower coordination, such as As$_{30}$Te$_{48}$Si$_{12}$Ge$_{10}$ ($C = 2.74$), a commonly used semiconductor glass. In fact, the worst hypothetical $C = 4$ glass ($E_g = 0.6$ eV) has a much larger value of $T_g - T_T$ (258 C) than the As$_{30}$Te$_{48}$Si$_{12}$Ge$_{10}$ alloy ($E_g = 1$ eV, $T_g - T_T = 181°$ C).

The foregoing analysis leads to the selection of a-CdAs$_2$ as a highly reliable switching material. a-CdAs$_2$ has a band gap ~ 0.7 eV and has a mean coordination number of 4. Devices using a-CdAs$_2$ as the active material have been prepared under a variety of deposition conditions. In accordance with the invention, it has been discovered that a-CdAs$_2$ thin films (films less than 10 microns thick) with close to stochiometric composition can be formed readily from bulk evaporation, i.e. evaporation from an open source, it is previously being believed that thin films of a-CdAs$_2$ could only be produced by the more expensive and more complicated process of flash evaporation wherein small CdAs$_2$ crystals are evaporated by sprinkling them on a heated filament. The non-crystalline nature of the CdAs$_2$ thin films was established by differential scanning calorimetry of stripped films. The thermograms at a heating rate of 5C/minute show the films to have a glass transition temperature of 290°C, two onsets of phase separation and crystallization at approximately 320° C and approximately 350°C and melting of the metastable hypereutectic Cd$_3$As$_2$ - As system, as is also the case in bulk samples obtained by quenching from a melt of Cd and As. Low field conductivity measurements show the bulk evaporated material to have a band gap of approximately 0.7 eV. Examination of the a-CdAs$_2$ films by scanning electron microscopy showed that the thin films are quite uniform in composition.

As noted, CdAs$_2$ is a highly reliable switching material for current controlled negative differential resistance (CNDR) devices and threshold switches. A thin film sandwich structure CNDR device such as the device 10 of FIG. 3, has been made by successive vapor deposition and photolithographic processing of Cr, a-CdAs$_2$ and Al layers on a substrate of corning 0211 glass. The glass substrate 12 (2.5 × 2.5 × 0.018 cm) was cleaned by successive immersion in acetone, ethanol, and water with N$_2$ agitation. Further cleaning in white etch (75:20:5, by volume, of H$_2$O: conc. HNO$_3$: conc. HF) for 30 sec, followed by a 3 minute water rinse, completed the basic cleaning cycle. The substrate was then immersed in isopropanol and dried in a centrifugal spin dryer at 1200 rpm.

The Cr layer 14 was deposited to a thickness of 0.25 um by sublimation from a tungsten boat at 10$^{-7}$ Torr. The substrates were held at 100°C during the deposition after being baked at 200°C for 15 min at approximately 6 × 10$^{-7}$ Torr. This layer 14 formed one electrode of the CNDR device.

The a-CdAs$_2$ layer 16 was deposited to the desired thickness (0.1-5 um) by evaporation of ground bulk CdAs$_2$. The bulk CdAs$_2$ was prepared conventionally in 0.3 mole batches by sealing the constituents Cd and As in a quartz ampoule at 10$^{-4}$ - 10$^{-5}$ Torr, reacting the Cd and As at 500°C for 4 hours, homogenizing at 800°C for 22 hours under continuous agitation, cooling to 650°C and holding at that temperature for 4 hours prior to quenching into an ice-brine bath. Reducing the temperature to 650°C allowed the quartz ampoule to be quenched without breaking. The bulk CdAs$_2$ was then ground to particles having a diameter of less than 1 mm.

The evaporation of the bulk CdAs$_2$ particles is achieved by evaporation from a tungsten boat at 10$^{-7}$ Torr. The a-CdAs$_2$ layer 16 is preferably held at 100°C during the evaporation, however, the layer 16 can be maintained between 25° and 200°C without significant change in film stochiometry or structure.

Electron microprobe studies of deposited layer 16 confirmed that the resultant material was stochiometric a-CdAs$_2$, within experimental error. This allowed, in accordance with the invention, evaporations to be performed from the bulk instead of having to resort to flash evaporation procedures. The thermal properties of a-CdAs$_2$ were determined by DSC analysis of samples stripped from 1 × 3 inches glass substrates included with each deposition. The resulting thermograms at a heating rate of 5°C min$^{-1}$ showed the material to have a glass transition temperature of 290°C, two onsets of phase separation and crystallization at 320°C and 350°C and, melting of the metastable hypereutectic Cd$_3$As$_2$-As system at 526°C as in the bulk quenched samples.

Figure 3:
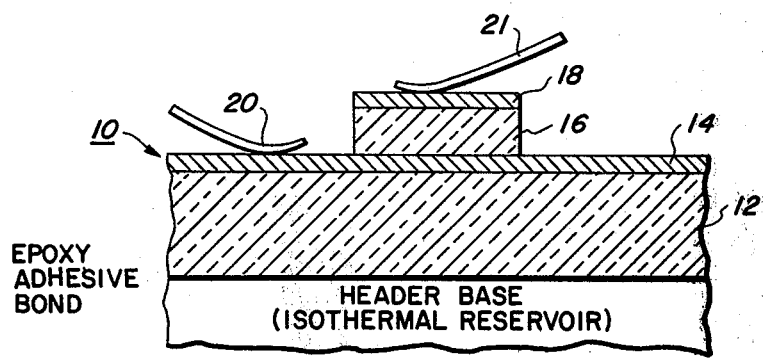
FIG. 3 is a cross-sectional view of an amorphous switching device which exhibits current controlled negative differential resistance (CNDR) and utilizes $a-CdAs_2$ as the active medium.

Upon completion of the a-CdAs$_2$ deposition, the substrates were cooled to room temperature and transferred to another vapor deposition system where 0.5 um Al layer 18 was deposited on layer 16 at $10^{-7}$ Torr. The vertical surfaces of layer 16 and the surface of layer 14 are masked during the deposition of the aluminum layer 18. Layer 18 was deposited onto unheated substrates so as to minimize the thermal cycling of the metastable a-CdAs$_2$ layer. As shown by FIG. 3, the layer 16 is coextensive with layer 18 and thus, in accordance with the teaching of copending U.S. patent application Ser. No. 412,211, filed Nov. 2, 1973, now U.S. Pat. No. 3,906,537, provides a CNDR characteristic instead of a threshold switching function which would be the case if the layer 18 was not coextensive with the layer 16. Electrical connections to the layer 14 and to the layer 18 are provided with 2.54 × $10^{-3}$ cm Al-Si wire 20 and 21 which are attached to these layers by ultrasonic bonding.

Figure 4:
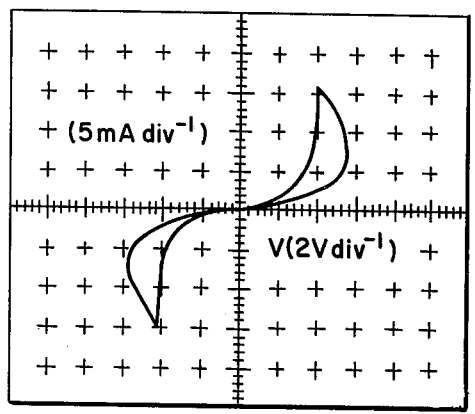
FIG. 4 is the voltage-current characterstic of the device of FIG. 3.

The V-I trace for the CNDR device of FIG. 3 at room temperature is shown in FIG. 4. This characteristic was displayed with layer 16 and layer 18 being of circular configuration and having an area of approximately 8 × $10^{-3}$ cm$^2$. The hysteresis in the trace results from continued heating of the semiconductor during the curve tracer retrace. The current density at turnover is about 6A cm$^{-2}$, and the turnover voltage, $V_T$, is polarity independent. This latter result suggests that CNDR is a bulk rather than an electrode induced phenomenon, since the electrode materials are dissimilar.

TABLE I

| $E_g$(eV) | $T_T$(K) | $V_T$(V at 1 μm) |
|---|---|---|
| 0.6 | 331.6 | 0.262 |
| 0.7 | 326.2 | 0.685 |
| 0.8 | 322.4 | 1.791 |
| 0.9 | 319.5 | 4.698 |
| 1.0 | 317.4 | 12.29 |
| 1.1 | 315.6 | 32.28 |
| 1.2 | 314.27 | 84.64 |

It has been shown that a group of materials, including a-CdAs$_2$ thin films, are applicable for high reliability switching devices. The basis for material selection is based on the relationship between glass transition temperature ($T_g$), band gap ($E_g$) and mean coordination number (C) of covalently bonded glasses. Glasses having a coordination number of 4, and a band gap between 0.6 and 1.2 eV possess a glass transition temperature which is sufficiently high to make them useful in switching devices such as the device of FIG. 3.

I claim:
1. A non-rectifying solid state switching device comprising:
   a body of amorphous CdAs$_2$, and
   at least two spaced electrodes in contact with said body.
2. A non-rectifying solid state switching device comprising:
   a thin film of amorphous CdAs$_2$, and
   at least two spaced electrodes in contact with opposed surfaces of said thin film;
   said thin film being less than 10 microns thick.

* * * * *